US008963658B2

(12) United States Patent  (10) Patent No.: US 8,963,658 B2
Chen et al.  (45) Date of Patent: Feb. 24, 2015

(54) MICROPSTRIP TRANSMISSION LINE/COPLANAR WAVEGUIDE (CPW) TRANSISTOR STRUCTURE

(75) Inventors: James J. Chen, Lynnfield, MA (US); Nicholas J. Kolias, Winchester, MA (US); Francois Y. Colomb, Westford, MA (US)

(73) Assignee: Raytheon Company, Waltham, MA (US)

( * ) Notice: Subject to any disclaimer, the term of this patent is extended or adjusted under 35 U.S.C. 154(b) by 373 days.

(21) Appl. No.: 12/886,653

(22) Filed: Sep. 21, 2010

(65) Prior Publication Data

US 2012/0068793 A1   Mar. 22, 2012

(51) Int. Cl.
H01P 5/08   (2006.01)
H01P 5/02   (2006.01)
H01L 29/812  (2006.01)

(52) U.S. Cl.
CPC ....... *H01P 5/028* (2013.01); *H01P 5/08* (2013.01); *H01L 29/812* (2013.01)
USPC ............................ 333/247; 257/664; 257/728

(58) Field of Classification Search
CPC .......... H01P 5/08; H01P 5/028; H01L 29/812
USPC ........... 333/208–212, 246, 247; 257/664, 728
See application file for complete search history.

(56) References Cited

U.S. PATENT DOCUMENTS 4,587,541 A * 5/1986 Dalman et al. ................ 257/259
5,550,518 A * 8/1996 Mohwinkel ..................... 333/33
7,119,635 B2 * 10/2006 Yoshimoto et al. ........... 333/185

OTHER PUBLICATIONS

RF and Microwave Engineering, Fundamentals of Wireless Communications; Frank Gustrau; 2012; p. 128.*
Sequeira et al., "Monolithic GaAs W-Band Pseudomorphic MODFET Amplifiers", IEEE GaAs IC Symposium, 1990, pp. 161-164.
Golja et al., "A Coplanar-to-Microstrip Transition for W-Band Circuit Fabrication with 100-μm-Thick GaAs Wafers", IEEE Microwave and Guided Wave Letters, vol. 3, No. 2, Feb. 1993, pp. 29-31.
D. Harvey, "A lumped coplanar to microstrip transition model for de-embedding S-parameters measured on GaAs wafers," 29th Automatic RF Tech. Group Conf. Proc., Las Vegas, NV, pp. 204-217, Jun. 1987.

* cited by examiner

*Primary Examiner* — Benny Lee
*Assistant Examiner* — Rakesh Patel
(74) *Attorney, Agent, or Firm* — Daly, Crowley, Mofford & Durkee, LLP

(57) ABSTRACT

A structure having a coplanar waveguide transistor; and a microwave section, coupled to the transistor, having: a strip conductor coplanar with the electrodes of the coplanar waveguide transistor and a ground plane conductor disposed under the strip conductor.

6 Claims, 7 Drawing Sheets

MICROPSTRIP TRANSMISSION LINE/COPLANAR WAVEGUIDE (CPW) TRANSISTOR STRUCTURE

TECHNICAL FIELD

This disclosure relates generally to microstrip transmission line/coplanar waveguide (CPW) transistor structures.

BACKGROUND

As is known in the art, it is frequently desired to transition from one type of microwave transmission line to a different type of microwave transmission line, for example between coplanar waveguide transmission line to microstrip transmission line. As is also known in the art, one type of a transistor device used in amplifiers includes a control electrode (e.g., a gate electrode in a field effect transistor (FET) device or a base electrode in a bipolar device) for controlling carrier flow between a pair of electrodes (e.g., source and drain electrodes in a FET and collector and emitter for a bipolar transistor).

As is known in the art, one type of transistor arrangement includes a transistor coupled between a microwave transmission line input section and a microwave transmission line output section. Thus, there is a transition between the input section and the transistor and another transition between the transistor and the output section.

One type of microwave transmission line is a microstrip transmission line having a strip conductor on one surface of a substrate and a ground plane conductor on an opposite surface of the structure under the strip transmission line. With such a microstrip transmission line the electric field of the microwave energy propagating through the transmission line is within the substrate between, and perpendicular, to the strip conductor and the ground plane conductor.

Another type of microwave transmission line is a coplanar waveguide (CPW) transmission line where the strip conductor and ground plane conductor are on the same surface of the substrate (i.e., the strip conductor and ground plane conductor are coplanar). More particularly, the strip conductor provides a center conductor for the waveguide and the ground plane conductor has two sections; one on either side of the strip conductor. With such a coplanar waveguide transmission line the electric field of the microwave energy propagating through the transmission line is adjacent to the surface of the substrate between the strip conductor and the ground plane conductor.

As is also known in the art, with one type of transistor, the control electrode includes an electrical conductor disposed on one surface, for example the upper surface, of a semiconductor substrate, such conductor has a conductive pad terminating in a plurality of parallel conductive fingers (sometimes called gate fingers). One of the aforesaid pair of electrodes (e.g. drain) includes an electrical conductor disposed on the upper surface of a semiconductor substrate having a conductive pad terminating in a plurality of conductive fingers disposed between selected pairs of the inner control electrode (e.g. gate) fingers. The other one of the pair of electrodes (e.g. source) has a plurality of electrically conductive pads disposed on the upper surface of the substrate. Each one of the control electrode (e.g. gate) fingers is disposed between a corresponding one of the first electrode (e.g. drain) fingers and a corresponding one of the second electrode (e.g. source) conductive pads. A plurality of air bridge conductors is disposed over the surface of the structure electrically interconnecting the plurality of second electrode conductive pads. The second electrode conductive pads adjacent the outer control electrode fingers are connected to a ground plane conductor on the bottom surface of the substrate with vias passing vertically through the substrate to form a FET device as shown in FIGS. 1A-1D. Thus, the structure has an input section comprising an input microstrip transmission line feeding the control (here) gate electrode of the transistor, and an output microstrip transmission line one of the aforesaid pair of electrodes, here drain electrode of the transistor and the second one of the aforesaid electrode, here source electrode, being grounded. Thus, the transistor is arranged as an amplifier.

As is also known in the art, a coplanar waveguide (CPW) transistor structure is often times desired (for example, to reduce source inductance and achieve higher gain). Here, as shown in FIGS. 2A, 2B, 2C and 2D, the input microwave transmission line and the output transmission line are coplanar waveguide (CPW) transmission lines. Thus, the input section has a strip conductor disposed as the center conductor between a pair of coplanar ground planes. Likewise, the output section has a strip conductor disposed as the center conductor between the pair of coplanar ground planes. More particularly, the pair of ground planes extend across the structure as shown and provides the ground plane conductor for the pads of the gate and drain electrodes. Thus, the electric field (indicated by the arrows) passing through the CPW input section is coupled to the gate electrode and is along the surface of the substrate. Likewise, the electric field passing through to the CPW output section is coupled from the drain pad and along the surface of the substrate. Thus, here the transistor is a CPW transistor because microwave energy is fed to it and coupled from it with CPW transmission lines. A disadvantage of CPW input/output impedance matching circuits (not shown) coupled to the CPW input and output sections is that their implementation requires a greater surface area than that required with the microstrip configuration of FIGS. 1A-1D).

As reported in an article entitled "Monolithic GaAs W-Band Pseudomorphic MODFET Amplifiers" by Sequeira et al., IEEE GaAs IC Symposium, 1990, pages 161-164, a microstrip-CPW structure is shown wherein the input and output sections are microstrip and the transistor is CPW. Here, the ground plane of the microstrip conductors is on the same surface as the ground plane conductor of the gate and drain pads of the coplanar waveguide transistor. More particularly, the strip conductors for the input section and output microstrip section along with the strip conductors for the input/output microstrip impedance matching networks are on the bottom surface of the substrate and the ground plane conductors of the microstrip input/output/impedance matching circuits are on the same (upper) surface as the gate and drain pads of the CPW transistor. These bottom strip conductors of the input and output sections then connect to the gate and drain electrode center conductors of the CPW transistor with vertically extending vias. Such an arrangement is difficult to package.

SUMMARY

In accordance with one embodiment, a structure is provided having: a coplanar waveguide transistor; and a microwave section, coupled to the transistor, having: a strip conductor coplanar with the electrodes for the coplanar waveguide transistor and a ground plane conductor disposed under the strip conductor.

In one embodiment, a structure is provided having: a coplanar waveguide transistor on a surface of the structure; and a microwave section, coupled to the transistor, having: a strip conductor disposed on said surface of the structure; and a ground plane conductor disposed under the strip conductor.

In one embodiment, a plurality of conductive vias pass into the structure electrically connecting an electrode of the transistor to the ground plane conductor.

In one embodiment, a structure is provided having a substrate and a transistor disposed on a surface of the substrate. The transistor includes a control electrode for controlling a flow of carriers between a pair of electrodes. The control electrode is a coplanar waveguide structure having a center conductor on the surface of the structure and a pair of ground plane conductors disposed adjacent the center conductor on the surface of the structure. The first one of the pair of electrodes is a coplanar waveguide structure having a center conductor and ground plane conductors disposed on the surface of the structure adjacent the center conductor. The second one of the pair of electrodes comprises a pair of the conductive pads providing the pair of ground plane conductors for the control electrode and the first one of the pair of electrodes.

In one embodiment, a structure is provided, having a substrate and a transistor on a surface of the substrate. The transistor has a control electrode for controlling a flow of carriers between a pair of electrodes. The control electrode is a coplanar waveguide structure having a center conductor on the surface of the structure and a pair of ground plane conductors disposed adjacent the center conductor on the surface of the structure. The center conductor terminates in a plurality of fingers on the surface of the structure. The first one of the pair of electrodes is a coplanar waveguide structure having a center conductor and ground plane conductors disposed on the surface of the structure adjacent the center conductor. The center conductor of the first one of the pair of electrodes terminates in a plurality of fingers on the surface of the structure. The second one of the pair of electrodes comprises: a plurality of conductive pads disposed on the surface of the structure, each one of the control electrode fingers being disposed between a corresponding one of the first electrode fingers and a corresponding one of the second electrode conductive pads; and a plurality of air bridge conductors disposed over the surface of the structure electrically interconnecting the plurality of conductive pads. A pair of the conductive pads of the second one of the pair of electrodes provides the pair of ground plane conductors for the control electrode and the first one of the pair of electrodes.

In one embodiment, a plurality of vias pass through the substrate to electrically connect a ground plane conductor on an opposite surface of the substrate to the pair of conductive pads of the second one of the pair of electrodes.

In one embodiment, a microstrip input section is coupled to the control electrode comprising: a strip conductor disposed on the surface of the substrate and connected to the center conductor of the control electrode; and a ground plane conductor disposed on the opposite surface of the substrate under the strip conductor microstrip input section.

In one embodiment, a microstrip output section is coupled to the second one of the pair of electrodes comprising: a strip conductor disposed on the surface of the substrate and connected to the center conductor of the second one of the pair of electrodes; and a ground plane conductor disposed on the opposite surface of the substrate under the strip conductor of the microstrip output section.

The details of one or more embodiments of the disclosure are set forth in the accompanying drawings and the description below. Other features, objects, and advantages of the disclosure will be apparent from the description and drawings, and from the claims.

DESCRIPTION OF DRAWINGS

FIG. 1B being a cross section taken along line 1B-1B of FIG. 1A and FIG. 1C being a cross section taken along line 1C-1C in FIG. 1A; FIG. 1D being a cross section taken along line 1D-1D in FIG. 1A;

FIG. 2B being a cross section taken along line 2B-2B of FIG. 2A and FIG. 2C being a cross section taken along line 2C-2C in FIG. 2A; FIG. 2D being a cross section taken along line 2D-2D in FIG. 2A; FIG. 3B being a cross section taken along line 3B-3B of FIG. 3A; FIG. 3C being a cross section taken along line 3C-3C in FIG. 3A; FIG. 3D being a cross section taken along line 3D-3D in FIG. 3A; FIG. 3E being a cross section taken along line 3E-3E of FIG. 3A; and FIG. 3F being a cross section taken along line 3F-3F in FIG. 3A.

Like reference symbols in the various drawings indicate like elements.

DETAILED DESCRIPTION

Figure 1A:
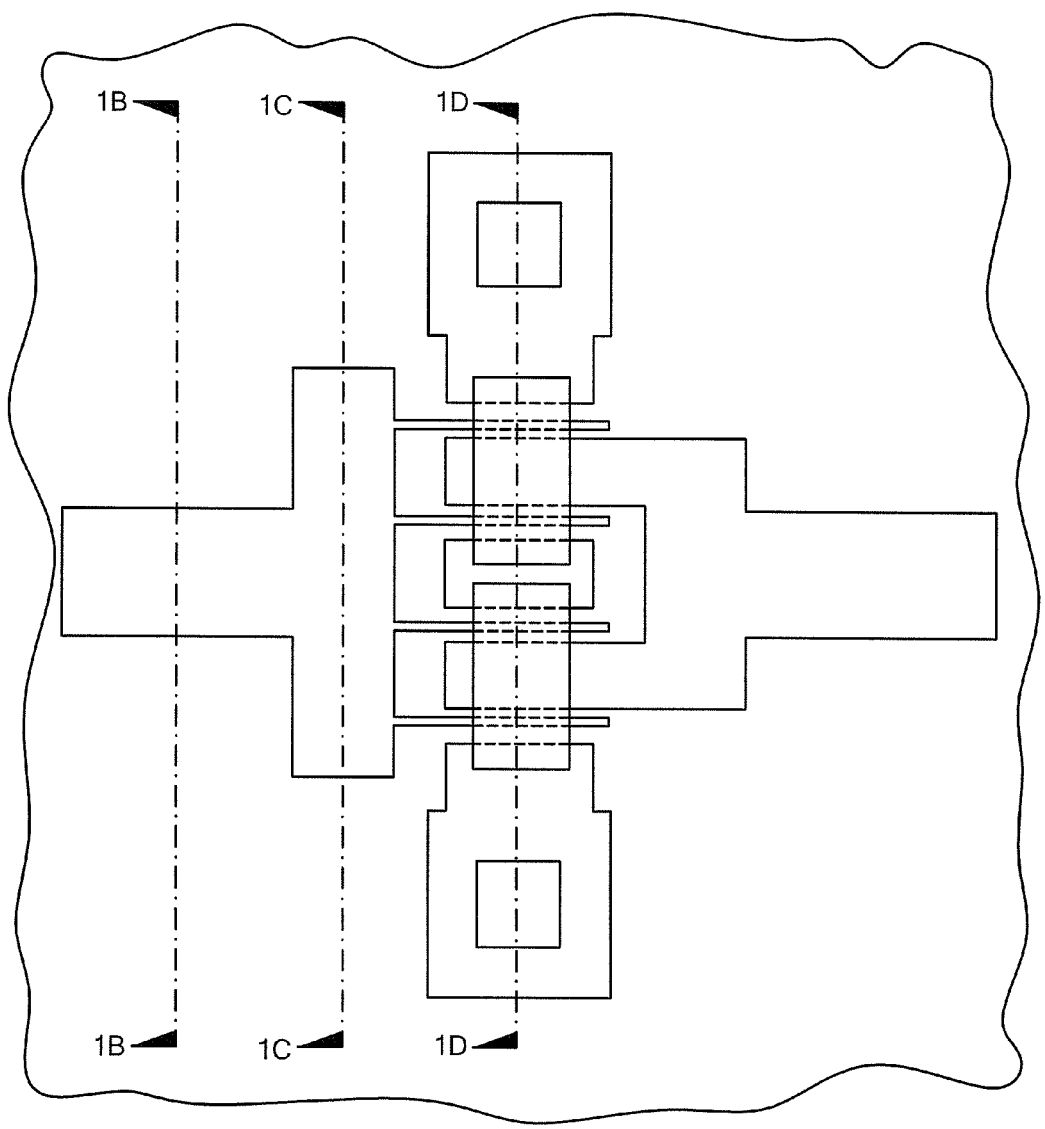
FIGS. 1A, 1B, 1C and 1D are plan and cross sectional sketches of an interconnected input section, transistor and an output section according to the PRIOR ART.
Figure 1B:
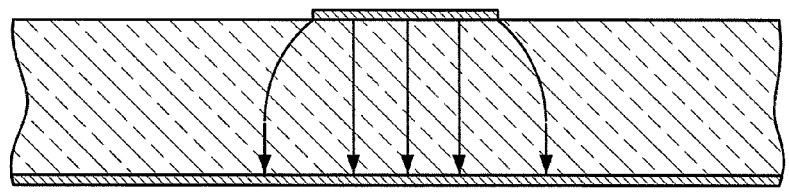
Figure 1C:
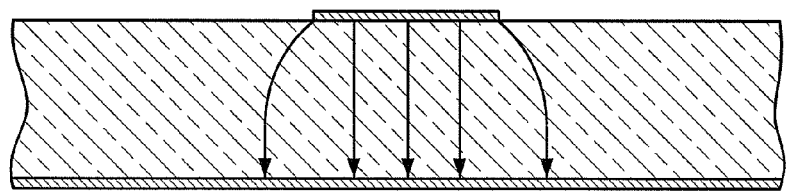
Figure 1D:
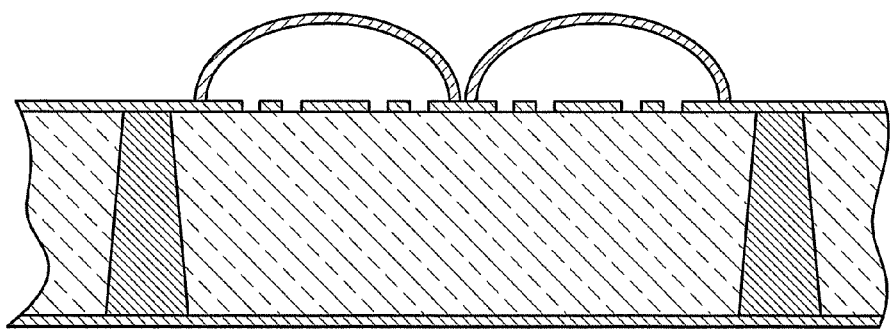
Figure 2A:
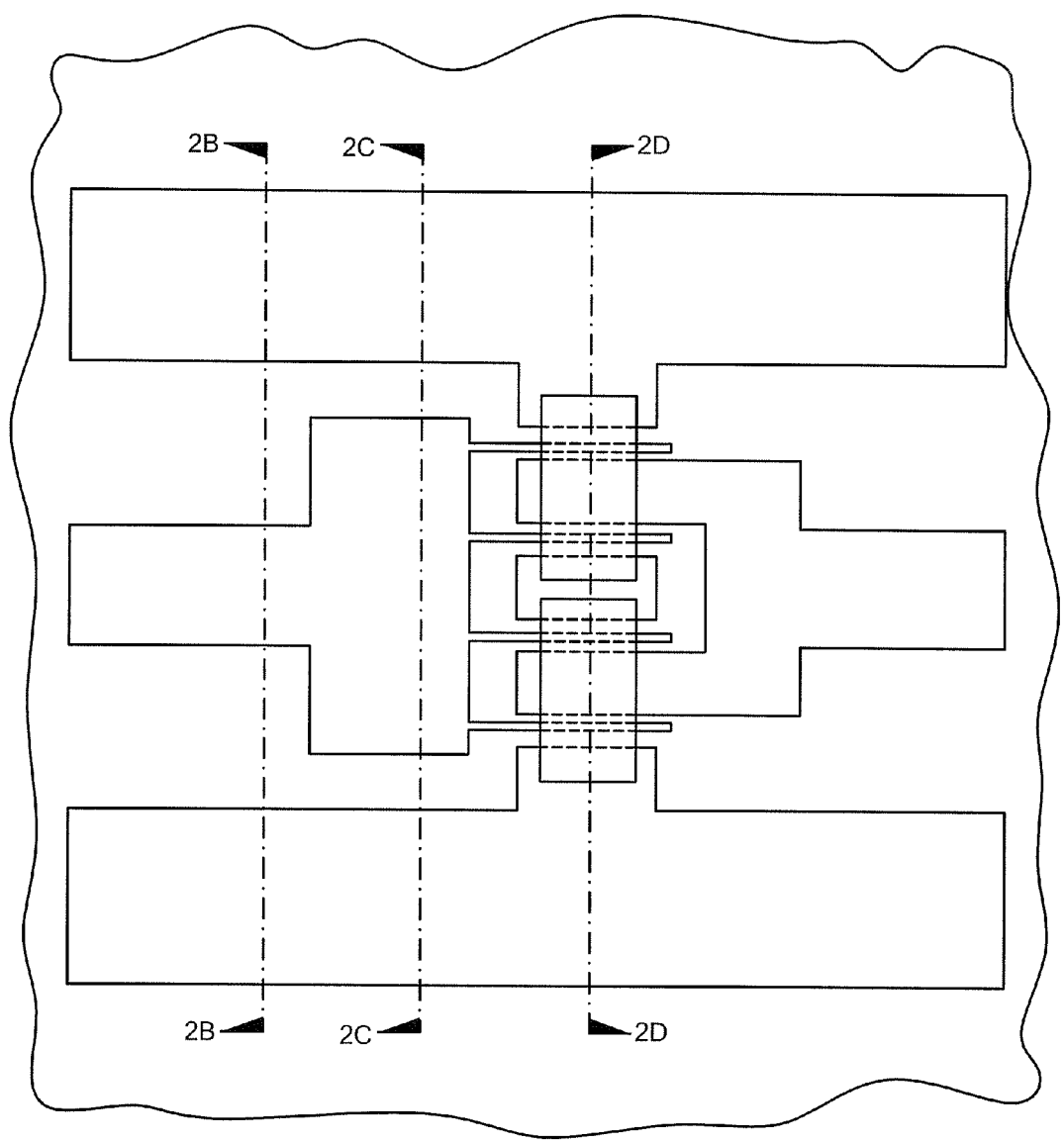
FIGS. 2A, 2B, 2C and 2D are plan and cross sectional sketches of an interconnected input section, transistor and an output section according to the PRIOR ART.
Figure 2B:
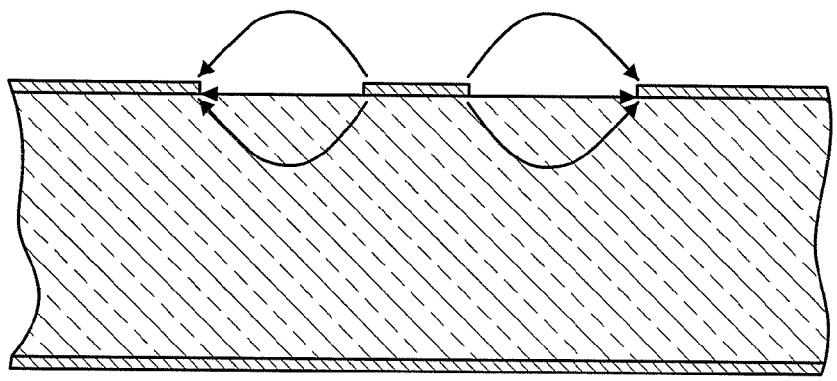
Figure 2C:
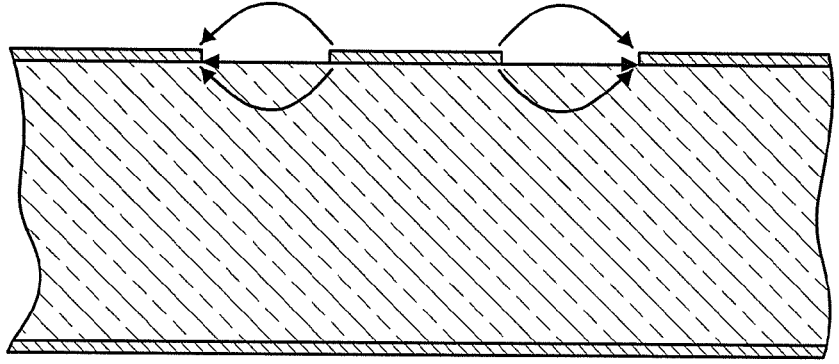
Figure 2D:
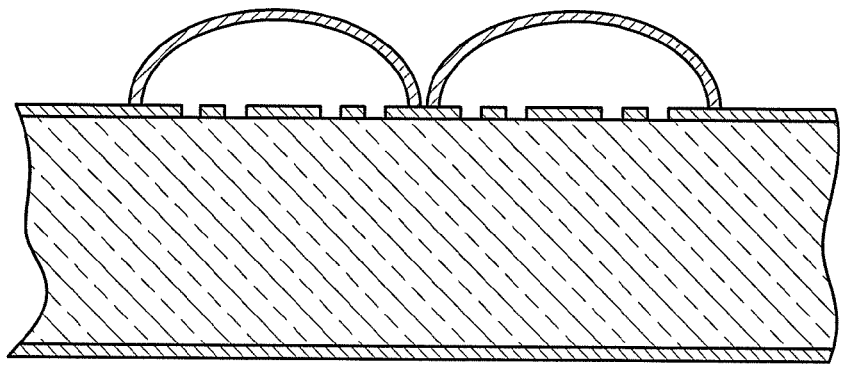
Figure 3A:
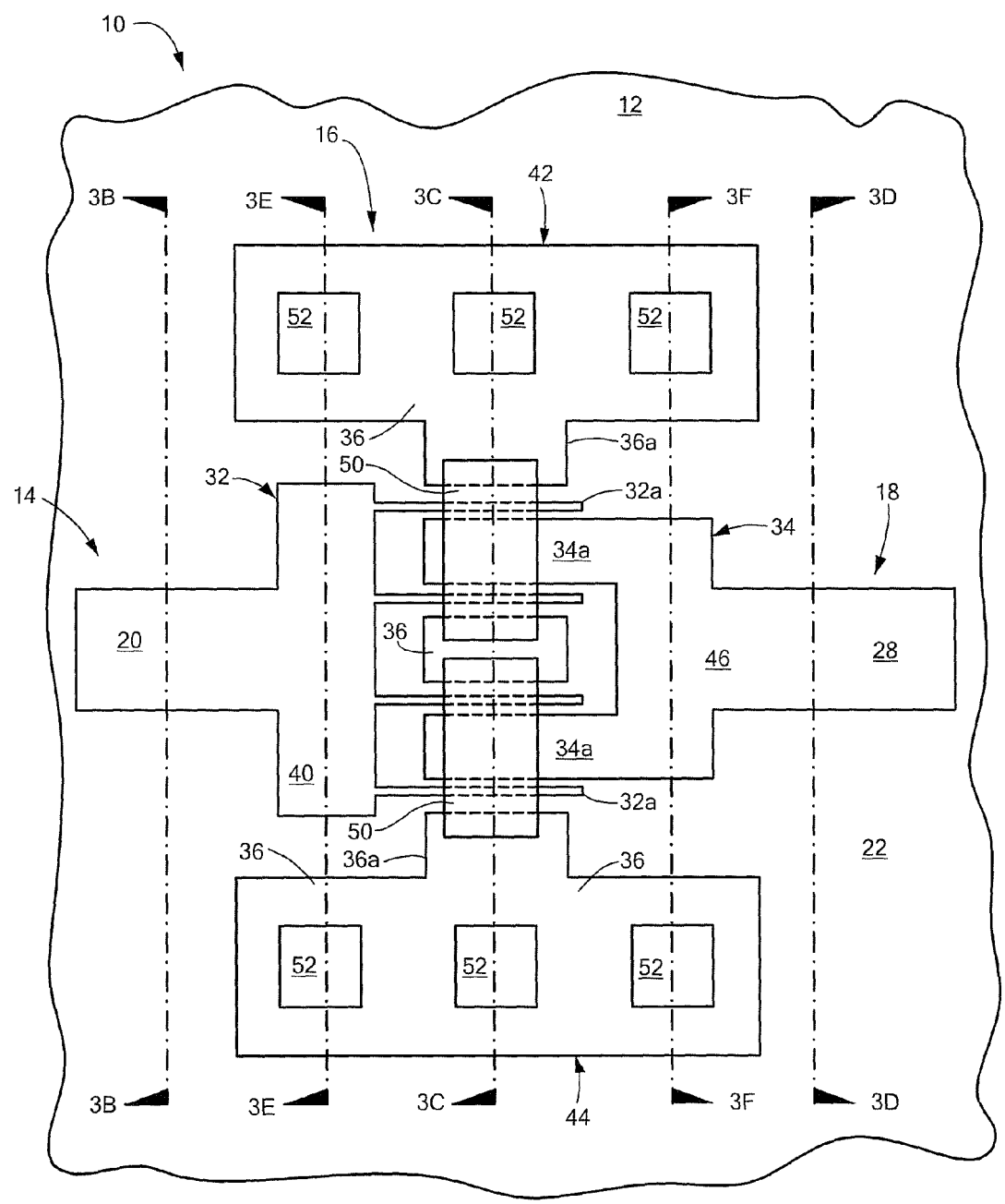
FIGS. 3A, 3B, 3C, 3D, 3E and 3F are plan and cross sectional sketches of an interconnected input section, transistor and an output section according to the disclosure.
Figure 3B:
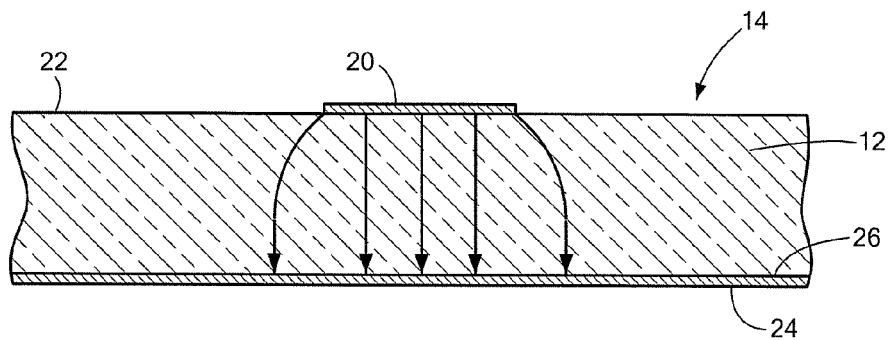
Figure 3C:
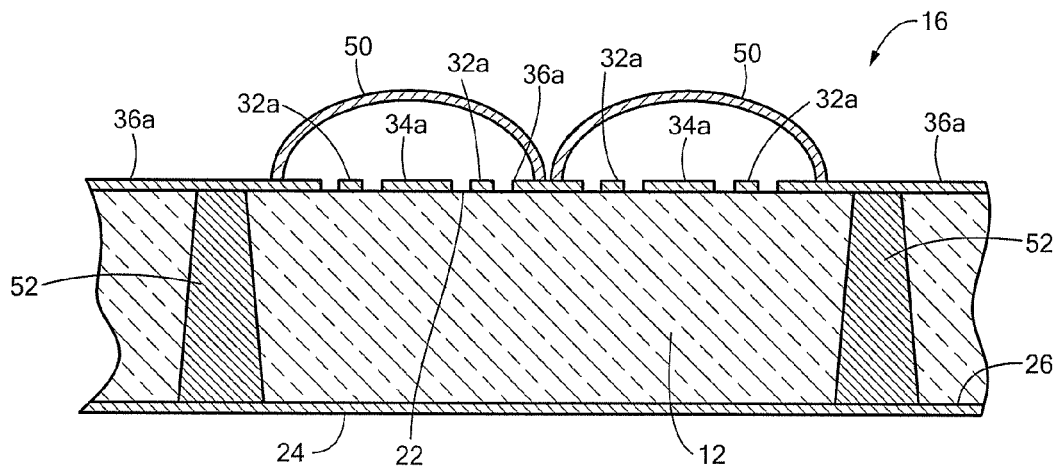
Figure 3D:
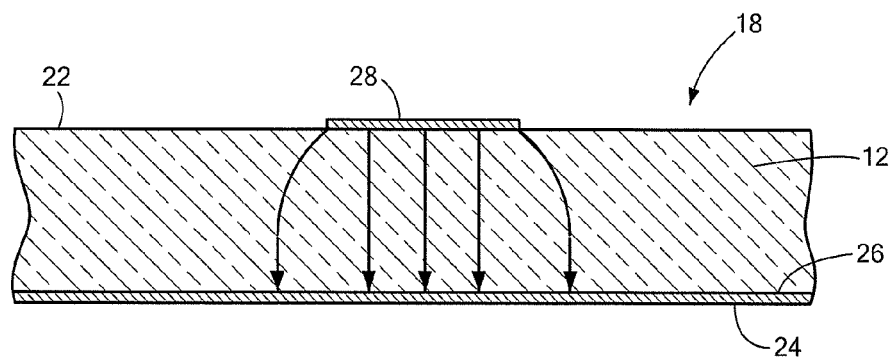
Figure 3E:
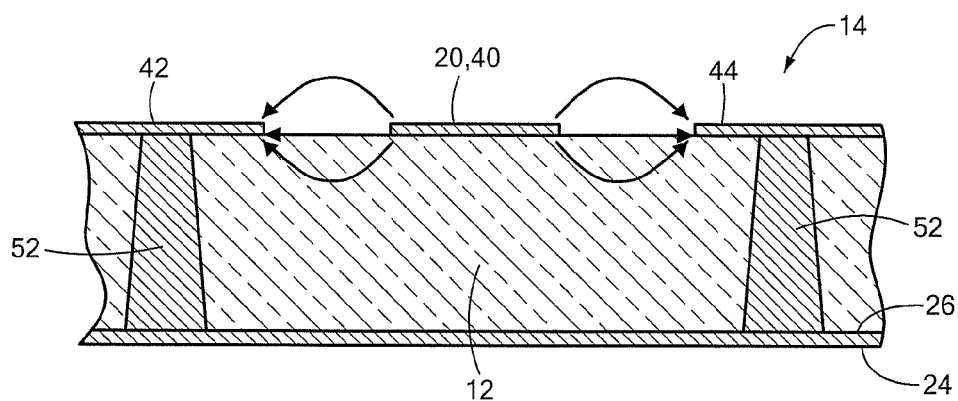
Figure 3F:
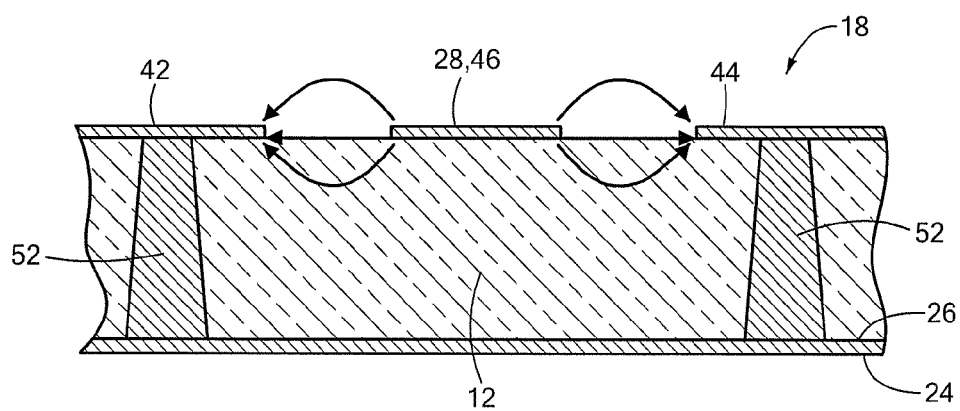

Referring now to FIGS. 3A-3F a structure 10 is shown having a substrate 12, here for example, a GaAs substrate, having: a microstrip input section 14 (FIG. 3B); a coplanar waveguide transistor 16 (FIG. 3C); and microstrip output section 18 (FIG. 3D). Microwave energy passing through the microstrip input section 14 is coupled to the transistor 16 through a microstrip to coplanar waveguide transition region (FIG. 3E) and microwave energy from the transistor 16 is coupled to the microwave output section 18 through a coplanar waveguide to microstrip transition region (FIG. 3F).

The microstrip input section 14 (FIG. 3B) includes: a strip conductor 20 disposed on the upper surface 22 of the substrate 12; the portion of a ground plane conductor 24 disposed on an opposite, i.e., bottom, surface 26 of the substrate 12 under the strip conductor 20, as shown in FIG. 3B; the electric field of microwave energy passing through the microwave input section being indicated by arrows shown in FIG. 3B.

The microstrip output section 18 (FIG. 3D includes: a strip conductor 28 disposed on the upper surface 22 of the substrate 12; the portion of a ground plane conductor 24 disposed on the opposite, i.e., bottom, surface 26 of the substrate 12 under the strip conductor 28, as shown in FIG. 3D; the electric field of microwave energy passing through the microwave output section 18 being indicated by arrows shown in FIG. 3D.

The coplanar waveguide transistor 16 has a control electrode 32 for controlling a flow of carriers between a pair of electrodes, 34, 36 (FIG. 3C); the control electrode 32, and pair of electrodes 34, 36 being disposed on the upper surface 22 of the substrate 12. Here, the transistor 16 is a field effect transistor (FET). The control electrode 32 is a gate electrode; the pair of electrodes 34, 36 is a drain electrode 34 and a source electrode 36. Here, in this example, the FET 16 is arranged as a grounded source amplifier. The gate electrode 32 is coupled to the microstrip input section 14 (FIG. 3B) through the microstrip to coplanar waveguide region, as shown in FIG. 3E and the drain electrode 34 is coupled to the microstrip output section 18 (FIG. 3D) through the coplanar waveguide to microstrip section (FIG. 3F).

More particularly, the strip conductor 20 of the microstrip input section 14 terminates in conductive gate electrode pad 40 disposed on the upper surface 22 of the substrate 12. The gate pad 40 is disposed centrally between adjacent portions of a pair of ground plane conductors 42, 44 also disposed on the upper surface 22 of the substrate 12. The vertical electric fields in the microstrip input section 14 (shown by the arrows in FIG. 3B) re-orient into electric fields along the upper surface 22 of the substrate 12 in the microstrip to coplanar waveguide transition, as shown by the arrows in FIG. 3E as such energy passes from the microstrip input section 14 to the coplanar waveguide structured gate electrode 32 of the transistor 16. The conductive gate pad 40 terminates in a plurality of, here for example four, parallel, electrically conductive gate fingers 32a on the upper surface of the substrate 12. The parallel conductive gate fingers 32a are in Schottky contact with the semiconductor substrate 12. It is noted that there are a pair of outer one of the gate fingers 32a and a plurality of, here for example two, inner gate fingers 32a disposed between the outer fingers 32a.

The strip conductor 28 of the microstrip output section 18 terminates in conductive drain electrode pad 46 disposed on the upper surface 22 of the substrate 12. The drain pad 46 is disposed centrally between adjacent portions of the pair of ground plane conductors 42, 44 and is also disposed on the upper surface 22 of the substrate 12 providing a coplanar waveguide structured drain electrode. The electric fields along the upper surface 22 of the substrate 12 in the drain pad 46, as shown by the arrows in FIG. 3F, re-orient into vertical electric fields in the microstrip output section 18, as such energy passes from the coplanar waveguide drain electrode pad 46 to the output microstrip section 18. The drain conductor pad 46 terminates in a plurality of, here two parallel fingers 34a, each one of the drain fingers 34a being in ohmic contact with the substrate 12. Each one of the drain fingers 34a is disposed between a pair of the gate fingers 32a.

The source electrode 36 includes a plurality of conductive source pads 36a disposed on the upper surface 22 of the substrate 12, each one of the gate fingers 32a being disposed between a corresponding one of the drain fingers 34a and a corresponding one of the source pads 36a. The source pads 36a are in ohmic contact with the semiconductor substrate 12. A plurality of, here two, air bridge conductors 50 are disposed over the upper surface 22 of the structure 10 electrically interconnecting the plurality of source pads 36a. It is noted that the outer pair of conductive source pads 36a extends laterally along the upper surface 22 of the substrate 12 and provides the pair of ground plane conductors 42, 44 for the coplanar waveguide gate electrode 32 and the coplanar waveguide drain electrode 34.

Electrically conductive vias 52 pass through the substrate 12 to electrically interconnect the pair of ground plane conductors 42, 44 on the upper surface 22 to the ground plane conductor 24 on the bottom surface 26 of the substrate 12, as shown in FIGS. 3C, 3E, and 3F.

Thus, with such an arrangement, microstrip input and output section are transitioned to and from, respectively, a CPW transistor with the ground plane of the microstrip input and output sections and the ground plane for the CPW transistor being on opposite surfaces of the substrate 12. Thus, structure may be easily packaged by mounting a conductive bottom surface of the package to the microstrip input and output section ground planes.

A number of embodiments of the disclosure have been described. Nevertheless, it will be understood that various modifications may be made without departing from the spirit and scope of the disclosure. For example, while a field effect transistor has been described, the transistor device may be a bipolar transistor device. Accordingly, other embodiments are within the scope of the following claims.

What is claimed is:

1. A structure comprising:
a semiconductor substrate having formed thereon:
(A) a first microstrip transmission line comprising: an input portion of a first strip conductor and; a first ground plane conductor portion disposed under the input portion of the first strip conductor and positioned to support a first electric field through the substrate between the input portion of the first strip conductor and the first ground plane conductor portion;
(B) a single transistor extending laterally along a predetermined length along portion of the substrate, the single transistor having a plurality of electrodes, wherein a first one of the plurality of electrodes is a control electrode for controlling a flow of carriers between a second one and a third one of the plurality of electrodes, wherein: an output portion of the first strip conductor provides a first conductive pad for the first one of the plurality of electrodes, the first one of the plurality of electrodes extending outwardly from the first conductive pad, a second conductive pad for the second one of the plurality of electrodes, the second one of the plurality of electrodes extending outwardly from the second conductive pad, and the third one of the plurality of electrodes comprises a pair of third conductive pads, each one of the pair of third conductive pads having a first terminating end portion disposed adjacent to, and laterally spaced from, opposite sides of the first conductive pad and a second terminating end portion disposed adjacent to, and laterally spaced from, opposite sides of the second conductive pad; and
wherein the first conductive pad provides a center conductor for a first coplanar waveguide (CPW) transmission line and the first terminating end portion of each one of the pair of third conductive pads provides a ground plane conductor for the first CPW transmission line, the first CPW transmission line being connected between the first microstrip transmission line and the single transistor; and
wherein the first electric field transitions from the first microstrip transmission line to the first CPW transmission line having a second electric field between the first conductive pad and a first terminating end portion of each one of the pair of third conductive pads;
wherein the first terminating end portion of a first one of the pair of third conductive pads and the first terminating end portion of a second one of the pair of third conductive pads are disposed along a first straight line;
wherein the first conductive pad is disposed on the first straight line between the first terminating end portion of the first one of the pair of third conductive pads and the first terminating end portion of the second one of the pair of third conductive pads;
wherein the first terminating end portion of the first one of the pair of third conductive pads, the first conductive pad, and the first terminating end portion of the second one of the pair of third conductive pads form the first CPW transmission line; and
(C) a second microstrip transmission line comprising: an output portion of a second strip conductor; an input portion of the second strip conductor providing the second conductive pad for the second one of the plurality of electrodes, and a second ground plane conductor portion disposed under the output portion of the second strip conductor and positioned to support a third electric field through the substrate between the output portion of the second strip conductor and the second ground plane conductor, the second strip conductor being coplanar with the first, second, and pair of third conductive pads of the plurality of electrodes of the single transistor; and wherein each one of the pair of third conductive pads has a second terminating end portion disposed adjacent to, and laterally spaced from, opposite sides of the second conductive pad to support a fourth electric field between the second conductive pad and the second terminating end portion of each one of the pair of third conductive pads to provide a second coplanar waveguide (CPW) transmission line connected between the second microstrip transmission line and the single transistor;

wherein the second terminating end portion of a first one of the pair of third conductive pads and the second terminating end portion of a second one of the pair of third conductive pads are disposed on a second straight line;

wherein the second conductive pad is disposed on the second straight line between the second terminating end portion of the first one of the pair of third conductive pads and the second terminating end portion of the second one of the pair of third conductive pads;

wherein the second terminating end portion of the first one of the pair of third conductive pads, the second conductive pad, and the second terminating end portion of the second one of the pair of third conductive pads form the second CPW transmission line; and wherein each one of the pair of third conductive pads begins at the first terminating end, extends laterally along said predetermined length of the single transistor, and terminates at the second terminating end.

2. The structure recited in claim 1 including conductive vias passing into the structure electrically connecting portions of the pair of third conductive pads to respective underlying portions of the ground plane conductor.

3. The structure recited in claim 2 including an air-bridge structure interconnecting the pair of third conductive pads.

4. The structure recited in claim 1 wherein the input portion of the first strip conductor is narrower than the first conductive pad.

5. The structure recited in claim 1 wherein the first straight line passes through a region of the first CPW transmission line and the second straight line passes through a region of the second CPW transmission line.

6. A structure, comprising:
(A) a first microstrip transmission line comprising: an input portion of a strip conductor and a first ground plane conductor portion disposed under the strip conductor
(B) a single transistor comprising:
 a plurality of electrodes, wherein a first one of the plurality of electrodes is a control electrode for controlling a flow of carriers between a second one and a third one of the plurality of electrodes;
 a first conductive pad, the first one of the plurality of electrodes extending outwardly from the first conductive pad;
 a second conductive pad, the second one of the plurality of electrodes extending outwardly from the second conductive pad; and
 a pair of third conductive pads, the third one of the plurality of electrodes extending outwardly from the pair of third conductive pads, each one of the pair of third conductive pads having a first portion disposed adjacent to, and laterally spaced from, opposite sides of the first conductive pad; and
 wherein the first conductive pad provides a center conductor for a first coplanar waveguide (CPW) transmission line and the first portion of each one of the pair of third conductive pads provides a ground plane conductor for the first CPW transmission line, the first CPW transmission line being connected to the first microstrip transmission line; and
(C) a second microstrip transmission line, having: a second strip conductor coplanar with the first, second, and pair of third conductive pads of the plurality of electrodes of the single transistor; and a second ground plane conductor portion disposed under the second strip conductor; and
 wherein each one of the pair of third conductive pads has a second portion disposed adjacent to, and laterally spaced from, opposite sides of the second conductive pad to provide a second coplanar waveguide (CPW) transmission line connected to the second microstrip transmission line; and
(D) wherein the single transistor extends along a predetermined length and wherein each one of the pair of third conductive pads begins at the first portion, extends laterally along said predetermined length, and terminates at the second portion.

\* \* \* \* \*